(12) United States Patent
Sarkees et al.

(10) Patent No.: US 7,859,334 B2
(45) Date of Patent: Dec. 28, 2010

(54) HYBRID POWER CONTROL FOR A POWER AMPLIFIER

(75) Inventors: George R. Sarkees, Pembroke Pines, FL (US); Lee V. Nagle, Coral Springs, FL (US)

(73) Assignee: Motorola, Inc., Schaumburg, IL (US)

( * ) Notice: Subject to any disclaimer, the term of this patent is extended or adjusted under 35 U.S.C. 154(b) by 66 days.

(21) Appl. No.: 12/325,572

(22) Filed: Dec. 1, 2008

(65) Prior Publication Data

US 2010/0134184 A1    Jun. 3, 2010

(51) Int. Cl.
    *H03G 3/20*  (2006.01)
(52) U.S. Cl. ............................... 330/129; 330/279
(58) Field of Classification Search ............ 330/129, 330/279, 136, 285, 296
    See application file for complete search history.

(56) References Cited

U.S. PATENT DOCUMENTS

| 5,051,707 A * | 9/1991 | Fujita .................. 330/279 |
| 5,220,290 A * | 6/1993 | Black .................. 330/279 |
| 5,278,994 A | 1/1994 | Black |
| 5,378,996 A | 1/1995 | Pai |
| 5,412,341 A | 5/1995 | Walczak |
| 5,977,831 A * | 11/1999 | Davis et al. .......... 330/279 |
| 6,430,402 B1 | 8/2002 | Agahi-Kesheh |
| 7,224,228 B2 * | 5/2007 | Takahashi et al. ...... 330/279 |
| 7,352,244 B2 * | 4/2008 | Takahashi et al. ...... 330/279 |
| 2003/0155978 A1 | 8/2003 | Pehlke |
| 2003/0181173 A1 | 9/2003 | Sugar et al. |
| 2008/0180169 A1 | 7/2008 | Ripley et al. |

FOREIGN PATENT DOCUMENTS

WO    2007112772    10/2007

OTHER PUBLICATIONS

International Search Report and Written Opinion dated Jul. 26, 2010 in related case PCT/US2009/063841.

* cited by examiner

*Primary Examiner*—Henry K Choe
(74) *Attorney, Agent, or Firm*—Anthony P. Curtis

(57) ABSTRACT

A hybrid power control system (102) that selectively applies voltage-based gain control and current-based gain control and method (300) of controlling a power amplifier (104) gain are presented. A voltage-based gain control signal (120) is applied to control the gain of the power amplifier when a level output power is indicated by a power contour signal (132). Whether the power amplifier is saturated is identified. A current-based gain control signal (122) is applied to control the gain of the power amplifier when the power amplifier is saturated and a decrease in output power is indicated by the power contour signal.

20 Claims, 3 Drawing Sheets

HYBRID POWER CONTROL FOR A POWER AMPLIFIER

TECHNICAL FIELD

The present invention generally relates to power amplifiers and, more particularly, to power level control in power amplifiers.

BACKGROUND

Power amplifiers are typically used to increase the power level of an electrical signal. The relationship between the input power and the output power of a power amplifier is generally referred to as the "transfer function" of the power amplifier, and the magnitude of the transfer function is referred to as "gain." Radio frequency (RF) power amplifiers oftentimes implement a gain control architecture that can be used to vary amplifier gain, and thus RF signal output power, for power leveling purposes.

In a voltage controlled power amplifier, gain control is typically implemented by detecting the voltage level of the power amplifier's RF output signal and comparing that voltage level to a reference signal. In a current controlled power amplifier, gain control is typically implemented by detecting the current level of the RF output signal and comparing that current level to a reference signal. Voltage-based gain control typically provides accurate control over the power amplifier's power leveling characteristics, even when variations in voltage standing wave ratio (VSWR) and output voltage occur. In contrast, current-based gain control typically exhibits poor power leveling characteristics when VSWR and output voltage vary.

There are disadvantages to using voltage-based gain control, however. For example, if a voltage controlled power amplifier is amplifying a time division multiple access (TDMA) signal, the power amplifier typically will ramp up power to transmit in allocated time slots (i.e. on specific channels), and then ramp down power in time slots allocated to other systems. If saturation occurs during this process, transient adjacent channel power (ACP) is oftentimes generated by the power amplifier. Transient ACP is known to adversely interfere with communication signals on adjacent TDMA channels. This phenomenon is commonly referred to as "splattering."

BRIEF DESCRIPTION OF THE DRAWINGS

Preferred embodiments will be described below in more detail, with reference to the accompanying drawings, in which.

DETAILED DESCRIPTION

While the specification concludes with claims defining features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

Arrangements described herein relate to a hybrid power control system for controlling a gain of a power amplifier, for example a radio frequency (RF) power amplifier. The hybrid power control system can control the gain of the power amplifier both by detecting the voltage of the output signal generated by the power amplifier, and by detecting the current of the output signal. For example, when the output power of the amplifier is to be increased, or ramped, voltage-based gain control can be used to control the gain by monitoring the voltage of the output signal. As noted, voltage-based gain control can be used to provide accurate control over the amplifier's output characteristics, even when variations in voltage standing wave ratio (VSWR) and output voltage occur.

If saturation is detected in the amplifier, however, and thus it is desired to reduce the gain of the amplifier, current-based gain control can be implemented. In contrast to voltage-based gain control, current-based gain control can be used to control the gain of the power amplifier by monitoring the current of the output signal, and can do so without generating significant levels of transient adjacent channel power (ACP). Accordingly, signal degradation on adjacent TDMA channels due to transient ACP can be minimized.

Figure 1:
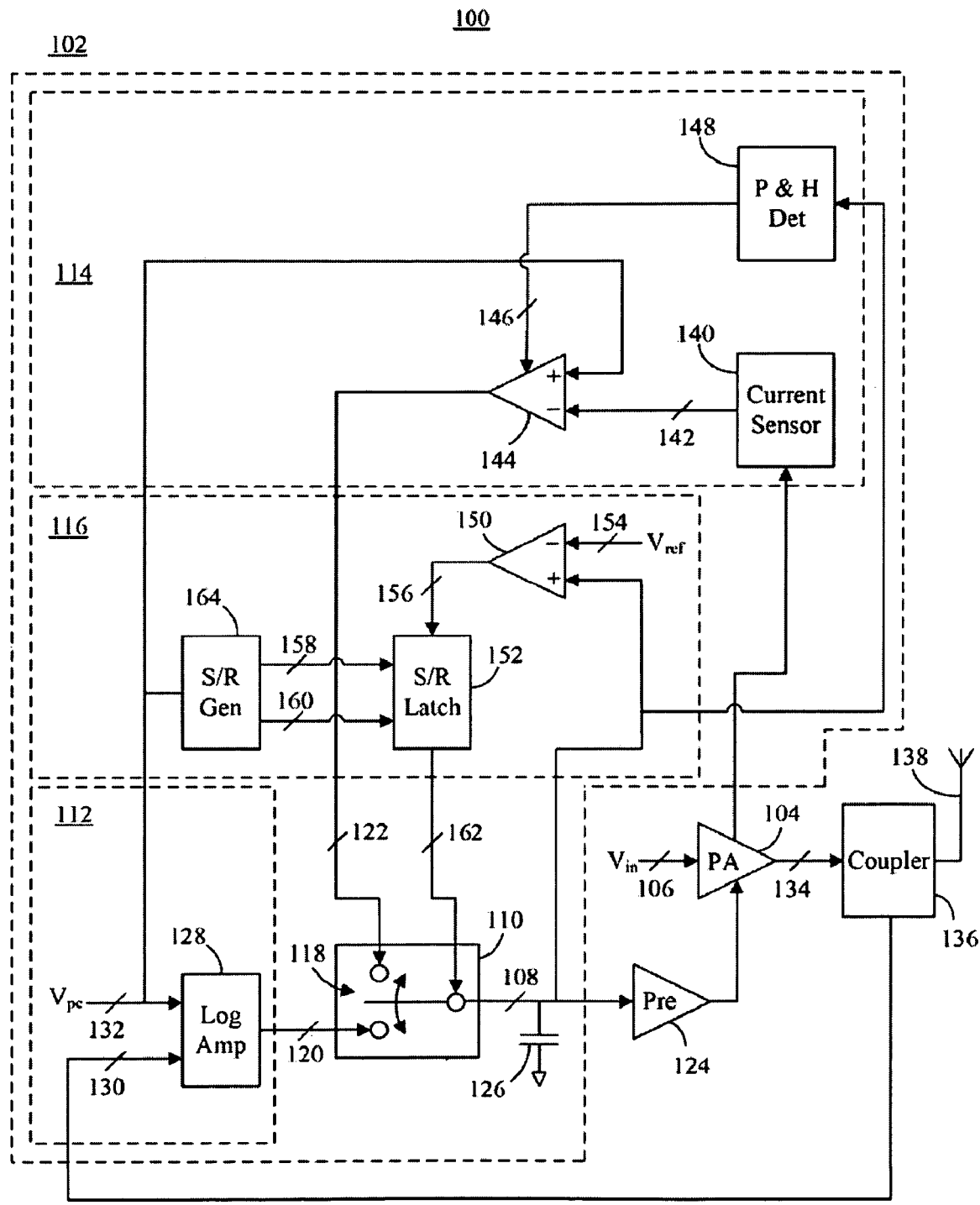
FIG. 1 depicts a power amplification system that is useful for understanding the present invention.

FIG. 1 depicts a power amplification system (hereinafter "system") 100 that is useful for understanding the present invention. The system 100 can include a hybrid power control system 102 and a gain controlled power amplifier (hereinafter "power amplifier") 104 that amplifies an input signal 106. In one arrangement, the input signal 106 can be an RF input signal, although the invention is not limited in this regard. Indeed, the input signal 106 can be an audio signal, or any other electrical signal for which power amplification is desired. The gain of the power amplifier 104 can be controlled by applying to the power amplifier 104 a gain control signal 108 generated by the hybrid power control system 102.

The hybrid power control system 102 can include a switch 110, a voltage-based gain control circuit 112, a current-based gain control circuit 114, and a saturation detection circuit 116. The switch 110 can select the gain control signal 108 from one or more available gain control signals. For example, the switch 110 can selectively change a signal input path 118 between the voltage-based gain control circuit 112, which generates a voltage-based gain control signal 120, and the current-based gain control circuit 114, which generates a current-based gain control signal 122. Operation of the switch 110 can be controlled by the saturation detection circuit 116, as will be described herein in greater detail.

Optionally, additional components also can be provided to amplify, condition, or otherwise process the gain control signal 108. For example, a pre-amplifier 124 can be provided to amplify the gain control signal 108 before the gain control signal 108 is input into the power amplifier 104. Further, active or passive filters, for example a capacitor 126, can be provided to filter transient surges that may be generated by the switch 110 during the switching process. It should be noted, however, that a myriad of other amplification/conditioning/ processing components can be used and the invention is not limited to these specific examples.

The voltage-based gain control circuit 112 can include a logarithmic amplifier 128. The logarithmic amplifier 128 can generate the voltage-based gain control signal 120 represented by the following equation:

$$V_{out} = K \ln \frac{V_i}{V_{pc}}$$

where $V_i$ is a voltage of an input signal 130, $V_{pc}$ is a voltage of a power contour signal 132, and K is a constant. The constant K can be selected to achieve a desired gain, for example using suitable passive and/or active electronic components (not shown). Logarithmic amplifier gain selection is well known to those skilled in the art.

In an alternate arrangement, a difference amplifier, which also is well known in the art, can be implemented within the hybrid power control system 102 in lieu of the logarithmic amplifier 128.

In the present example, the power contour signal 132 can be a signal that indicates a desired characteristic of an output signal 134 generated by the power amplifier 104. The desired characteristic can be, for example, a desired output power or a desired output voltage, for instance in accordance with a desired power modulation scheme, as will be described. For brevity, the term "output power" will be used in the examples described herein, but one skilled in the art will appreciate that the invention is not limited in this regard.

The input signal 130 can be generated from the output signal 134 of the power amplifier 104, thereby configuring the voltage-based gain control circuit 112 as a closed loop control circuit. For example, a coupler 136 can be provided between the power amplifier and a load, such as an antenna 138, to couple the output signal 134 of the power amplifier 104 to the logarithmic amplifier 128. In one arrangement, the coupler 136 can directly connect the output signal 134 of the power amplifier 104 to the logarithmic amplifier 128 as the input signal 130. In another arrangement, the coupler can include voltage sensing components that generate the input signal 130 from the power amplifier output signal 134. Such components are well known in the art.

The gain of the logarithmic amplifier 128 can be selected to achieve a voltage-based gain control signal 120 having desired characteristics for voltage-based gain control of the power amplifier 104. In that regard, the gain of the logarithmic amplifier 128 also can be selected to compensate for any gain or attenuation that may result from use of the coupler 136 to generate the input signal 130 from the output signal 134 of the power amplifier 104.

The current-based gain control circuit 114 can include a current sensor 140 that detects the current level of the output signal 134 generated by the power amplifier 104, and generates a current signal 142 that corresponds to the detected current level. For instance, the voltage of the current signal 142 can correspond to the detected current level. The current sensor 140 can comprise a voltage probe, a voltage divider circuit, or any other components suitable for sensing current.

The current-based gain control circuit 114 also can include a comparator 144. A voltage supply signal 146 can be provided as a positive voltage supply to the comparator 144 in order to tune the current-based gain control signal 122. The voltage supply signal 146 can be suitably selected so as to ensure that when the switch 110 switches from the voltage-based gain control signal 120 to the current-based gain control signal 122, the voltage levels from the voltage-based gain control signal 120 and the current-based gain control signal 122 are at least approximately the same. In particular, use of the voltage supply signal 146 as the positive supply voltage for the comparator 144 can cap the output of the comparator 144 to the voltage of the voltage supply signal 146. For example, when the voltage of the power contour signal 132 is greater than the voltage of the current signal 142, the output of the comparator 144 will be approximately equal to the voltage of the voltage supply signal 146.

Switching from the voltage-based gain control signal 120 to the current-based gain control signal 122 in this manner can minimize discontinuities in the gain control signal 108 during transition from the voltage-based control to the current-based control. Any remaining discontinuities that may be present in the gain control signal 108 can be smoothed by the capacitor 126 (or other suitable signal conditioning components). Thus, the use of a voltage supply signal 146 as the positive supply voltage input to the comparator 144 can prevent, or at least minimize, adverse effects that may otherwise result from such discontinuities.

In one arrangement, the voltage supply signal 146 can be generated by sampling the gain control signal 108 using a peak and hold detector 148 that suitably samples the gain control signal 108 and generates the voltage supply signal 146 that corresponds to the measured gain control signal samples. Thus, use of the peak and hold detector 148 provides a means of ensuring that the voltage supply signal 146 is adjusted to the proper voltage level to ensure that the voltage of the current-based gain control signal 122 is approximately equal to the voltage of the voltage-based gain control signal 120 when switching between voltage-based gain control and current based gain control occurs. Other components, for example application specific integrated circuits (ASICs), may be suitable for generating the voltage supply signal, however, and such components are within the scope of the present invention.

The current sensor 140 can output the current signal 142 to the comparator 144, which can compare the current signal 142 to the power contour signal 132 and generate the current-based gain control signal 122. The current-based gain control signal 122 can indicate whether the current signal 142 or the power contour signal 132 is larger. For example, in an arrangement in which the power contour signal 132 is provided to the non-inverting input of the comparator 144 and the current signal 142 is input into the inverting input of the comparator 144, if the voltage of the power contour signal 132 is greater than the voltage of the current signal 142, the voltage of the current-based gain control signal 122 can be approximately equal to the positive supply voltage of the comparator 144. If, however, the voltage of the power contour signal 132 is less than the voltage of the current signal 142, the voltage of the current-based gain control signal 122 can be approximately equal to the negative supply voltage of the comparator 144, for example 0 V. In one arrangement, the voltage supply signal 146 can be adjustable, and may be adjusted to calibrate the current-based gain control circuit 114, as will be described.

Further, the comparator 144 may be configured to not only compare the power contour signal 132 to the current signal 142, but to also filter the output signal to achieve a desired frequency response. For instance, if the input signal 106 is limited to a particular range of frequencies, additional passive and/or active electronic components (not shown) can be provided in the comparator circuit to implement pass band filtering. Alternatively, a separate filter can be used. Implementation of such signal filtering techniques is well known to those skilled in the art.

As noted, the switch 110 can select between the voltage-based gain control circuit 112 and the current-based gain control circuit 114 to provide the gain control signal 108 to the power amplifier 104, and operation of the switch 110 can be controlled by the saturation detection circuit 116. In one arrangement, the saturation detection circuit 116 can include a comparator 150 and a set/reset latch 152. The comparator 150 can compare the gain control signal 108 to a voltage reference signal 154 and generate a saturation indication signal 156 which indicates whether the power amplifier 104 is saturated based upon whether the gain control signal 108 or the voltage reference signal 154 is larger.

For example, if the voltage of the gain control signal 108 is greater than the voltage of the voltage reference signal 154, the voltage of the saturation indication signal 156 can be approximately equal to the positive supply voltage of the comparator 150. If, however, the voltage of the gain control signal 108 is less than the voltage of the voltage reference signal 154, the voltage of the saturation indication signal 156 can be approximately equal to the negative supply voltage of the comparator 150, for example 0 V. In this arrangement, the voltage reference signal 154 can be set to a voltage level that corresponds to the voltage level of the gain control signal 108 when the power amplifier 104 is saturated. Again, the voltage reference signal 154 can be adjustable, and may be adjusted to calibrate detection of power amplifier saturation, as will be described.

In another arrangement, rather than comparing the gain control signal 108 to the voltage reference signal 154, the comparator 150 can compare another signal, for example the power amplifier output signal 134, to the voltage reference signal 154 in order to generate the saturation indication signal 156. In this arrangement, the voltage reference signal 154 can be set to a voltage level that corresponds to the voltage level of the power amplifier output signal 134 when the power amplifier 104 is saturated.

The comparator 150 can communicate the saturation indication signal 156 to the set/reset latch 152. The set/reset latch 152 can process the saturation indication signal 156, along with at least one latch timing signal, for instance a latch timing set signal 158, to generate a switch control signal 162 that controls operation of the switch 110. Optionally, a second latch timing signal, for example a latch timing reset signal 160, also can be processed to generate the switch control signal 162. The latch timing set signal 158 and/or the latch timing reset signal 160 can indicate the present state of the power contour signal 132, for example when the amplitude of the power contour signal 132 is increasing or decreasing. The latch timing set/reset signals 158, 160 also can indicate when the amplitude of the power contour signal 132 is maintained high or maintained low.

The latch timing set signal 158 and/or the latch timing reset signal 160 can be generated from the power contour signal 132, for example using a set/reset signal generator 164. The set/reset signal generator 164 can comprise one or more voltage detectors, comparators and/or other circuits suitable for generating the set/reset signals. One or more voltage reference signals (not shown) also can be provided to the set/reset signal generator 164.

Figure 2:
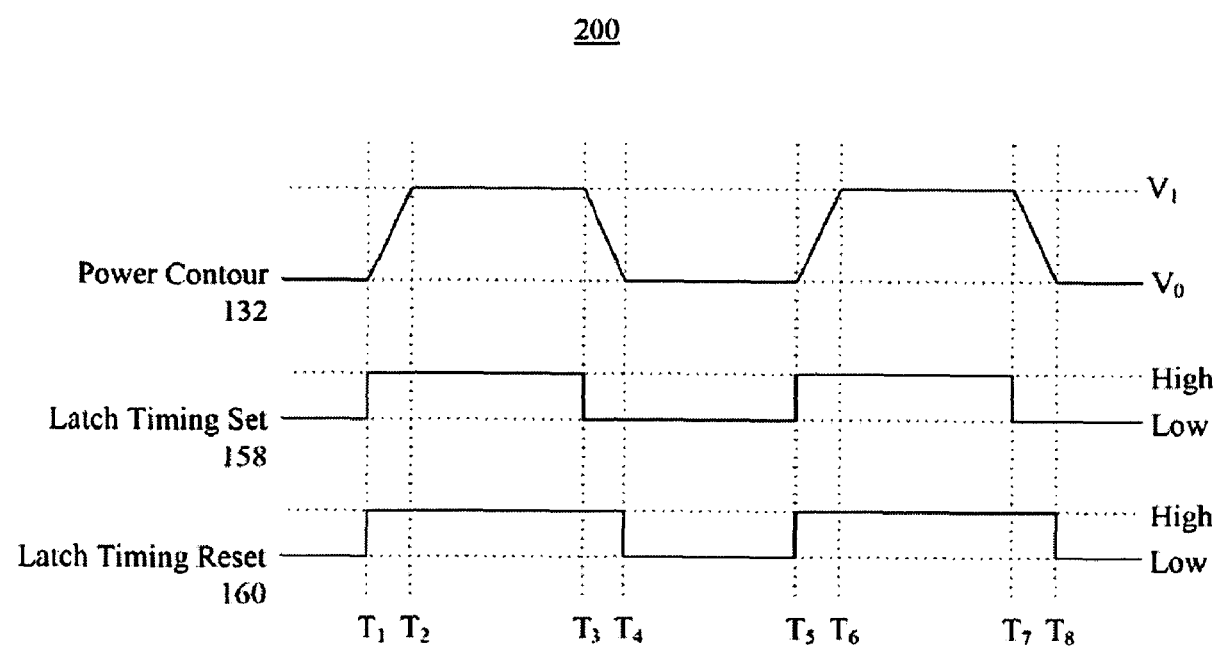
FIG. 2 depicts a timing signal diagram that is useful for understanding the present invention.

Referring to FIG. 2, a signal timing diagram 200 is depicted that presents examples of the power contour signal 132, the latch timing set signal 158 and the latch timing reset signal 160. At time $T_1$ the power contour signal 132 can begin to increase (e.g. ramp up) from an initial voltage $V_o$, which can be low, to a high voltage $V_1$. The initial voltage $V_o$ can be, for instance, 0 V and the high voltage $V_1$ can be a voltage suitable for achieving the desired maximum output power from the power amplifier. Thus, the period from time $T_1$ until time $T_2$ can indicate an output power increase, or ramp up.

At time $T_2$ the power contour signal 132 can reach the voltage $V_1$. From time $T_2$ until time $T_3$, the high voltage $V_1$ can be maintained. Accordingly, the period from time $T_2$ until time $T_3$ can indicate a level output power. At time $T_3$ the power contour signal 132 can begin to decrease (e.g. ramp down) from the high voltage $V_1$ to initial voltage $V_0$, reaching the $V_o$ at time $T_4$. Thus, the period from time $T_3$ until time $T_4$ can indicate an output power decrease, or ramp down. The power contour signal 132 can maintain the initial voltage $V_o$ until time $T_5$. The period from time $T_4$ until time $T_5$ can indicate that low or zero output power be maintained. At time $T_5$ the cycle can repeat and continue through times $T_6, T_7, T_8$, and so on.

As noted, the latch timing set/reset signals 158, 160 can be generated from the power contour signal 132. For the latch timing set/reset signals 158, 160, the corresponding voltage levels are indicated as low and high. The actual voltage levels represented by low and high are not critical so long as the set/reset latch is able to recognize and process transitions of the latch timing set/reset signals 158, 160 from low to high and from high to low.

At time $T_1$, the latch timing set signal 158 and the latch timing reset signal 160 can transition from low to high. Alternatively, the latch timing set signal 158 can transition from low to high at time $T_1$, and the latch timing reset signal 160 can transition from low to high at time $T_2$. At time $T_3$, the latch timing set signal 158 can transition from high to low. The latch timing reset signal 160 can transition from high to low at time $T_4$. Again, the cycles can repeat and continue through times $T_5, T_6, T_7, T_8$, and so on. In another arrangement, the respective voltage levels can be reversed. For example, the latch timing set signal 158 can be low from time $T_1$ to time $T_3$, high from time $T_3$ to time $T_5$, and so on. Similarly, the latch timing reset signal 160 can low from time $T_1$ to time $T_4$, high from time $T_4$ to time $T_5$, and so on.

Reference now should be made both to FIG. 1 and FIG. 2. When the power contour signal 132 indicates to increase the output power of the power amplifier 104 (e.g. ramp up output power) at time $T_1$, if the switch 110 does not already connect the signal input path 118 to the voltage-based gain control circuit 112, the transition of the latch timing set signal 158 and/or the transition of the latch timing reset signal 160 at time $T_1$ can trigger the set/reset latch 152 to connect the signal input path 118 to the voltage-based gain control circuit 112. Accordingly, the voltage-based gain control signal 120 can be used as the gain control signal 108 to provide voltage-based gain control of the power amplifier 104 during the period from time $T_1$ to time $T_3$ (e.g. during power ramp up and while level output power is desired).

In an alternative arrangement, the transition of the latch timing set signal 158 and/or the transition of the latch timing reset signal 160 at time $T_2$ can trigger the set/reset latch 152 to connect the signal input path 118 to the voltage-based gain control circuit 112. In such an arrangement, either voltage-based gain control or current-based gain control can be used to control the gain of the power amplifier 104 when output power is increased from time $T_1$ to time $T_2$, but the voltage-based gain control signal 120 can be used as the gain control signal 108 to provide voltage-based gain control of the power amplifier 104 during the period from time $T_2$ to time $T_3$ (e.g. while level output power is desired).

At time $T_3$, the latch timing set signal 158 can transition from high to low to indicate that the power contour signal 132 is indicating to decrease the output power of the power amplifier 104 (e.g. ramp down output power). If the saturation indication signal 156 indicates that the power amplifier 104 is not saturated when the power contour signal 132 indicates to decrease power, the set/reset latch 152 can maintain the switch 110 in its present state, thus keeping the signal input path 118 connected to the voltage-based gain control circuit 112.

If, however, the saturation indication signal 156 indicates that the power amplifier 104 is saturated when the power contour signal 132 indicates to decrease output power, the set/reset latch 152 can control the switch 110 to connect the signal input path 118 to the current-based gain control circuit 114. Thus, the current-based gain control signal 122 can be used as the gain control signal 108 to provide current-based gain control of the power amplifier 104 when output power is decreasing from time $T_3$ to time $T_4$. Accordingly, transient ACP that may otherwise be generated if the voltage-based gain control circuit 112 were to be used to provide gain control when the power amplifier 104 is saturated and the output power is being decreased.

In one arrangement, at time $T_4$ the latch timing reset signal 160 can transition from high to low to indicate that the power contour signal 132 is low. If the signal input path 118 is connected to the current-based gain control circuit 114, and the saturation indication signal 156 indicates that the power amplifier 104 is no longer saturated, the set/reset latch 152 can control the switch 110 to connect the signal input path 118 to the voltage-based gain control circuit 112. The set/reset latch 152 can maintain the switch 110 in that state until power amplifier saturation is again detected and an output power decrease is indicated.

In an alternate arrangement in which the latch timing reset signal 160 is not used, but the current-based gain control circuit 114 was used to provide gain control for output power increase from time $T_3$ to time $T_4$, the signal input path 118 can remain connected to the current-based gain control circuit 114 until time $T_5$ (or time $T_6$). At time $T_5$ (or time $T_7$) the transition of the latch timing set signal 158 can indicate to the set/reset latch 152 to control the switch 110 to connect the signal input path 118 to the voltage-based gain control circuit 112.

Now that operation of the hybrid power control system 102 has been described, calibration of the voltage supply signal 146 and the voltage reference signal 154 will be described. To calibrate the voltage supply signal 146, the voltage supply signal 146 can be set to 0 V. In addition, the power contour signal 132 can be input into the logarithmic amplifier 128 and the comparator 144. The voltage-based gain control signal 120 and the current-based gain control signal 122 also can be generated. The latch timing set signal 158 for at least one cycle can be sent to the set/reset latch 152, and the latch timing reset signal 160 can be set to high. Under these conditions, the set/reset latch 152 can set the switch to select the current-based gain control circuit 114. The voltage supply signal 146 then can be adjusted until the voltage of the power amplifier output signal 134 reaches a desired voltage level for a given voltage level of the power contour signal 132.

To calibrate the voltage reference signal 154, an input signal 106 that is level, or steady state, can be applied to the power amplifier 104. In addition, the gain control signal 108 that may be selectively varied and applied to the pre-amplifier 124, or directly to the power amplifier 104 if the pre-amplifier 124 is not used in the system 100. The voltage of the power amplifier output signal 134, the input signal 106, and the gain control signal 108 can be measured while the gain control signal 108 is increased from a desired initial value. Further, the voltage ratio of the output voltage of the power amplifier 104 to the voltage of the gain control signal 108 can be monitored. When the voltage ratio decreases by a determined percentage, for example 10%, the power amplifier can be determined to be saturated. The voltage of the gain control signal 108 then can be measured when, or just before, saturation is detected, and the voltage reference signal 154 can be set to that voltage value.

Figure 3:
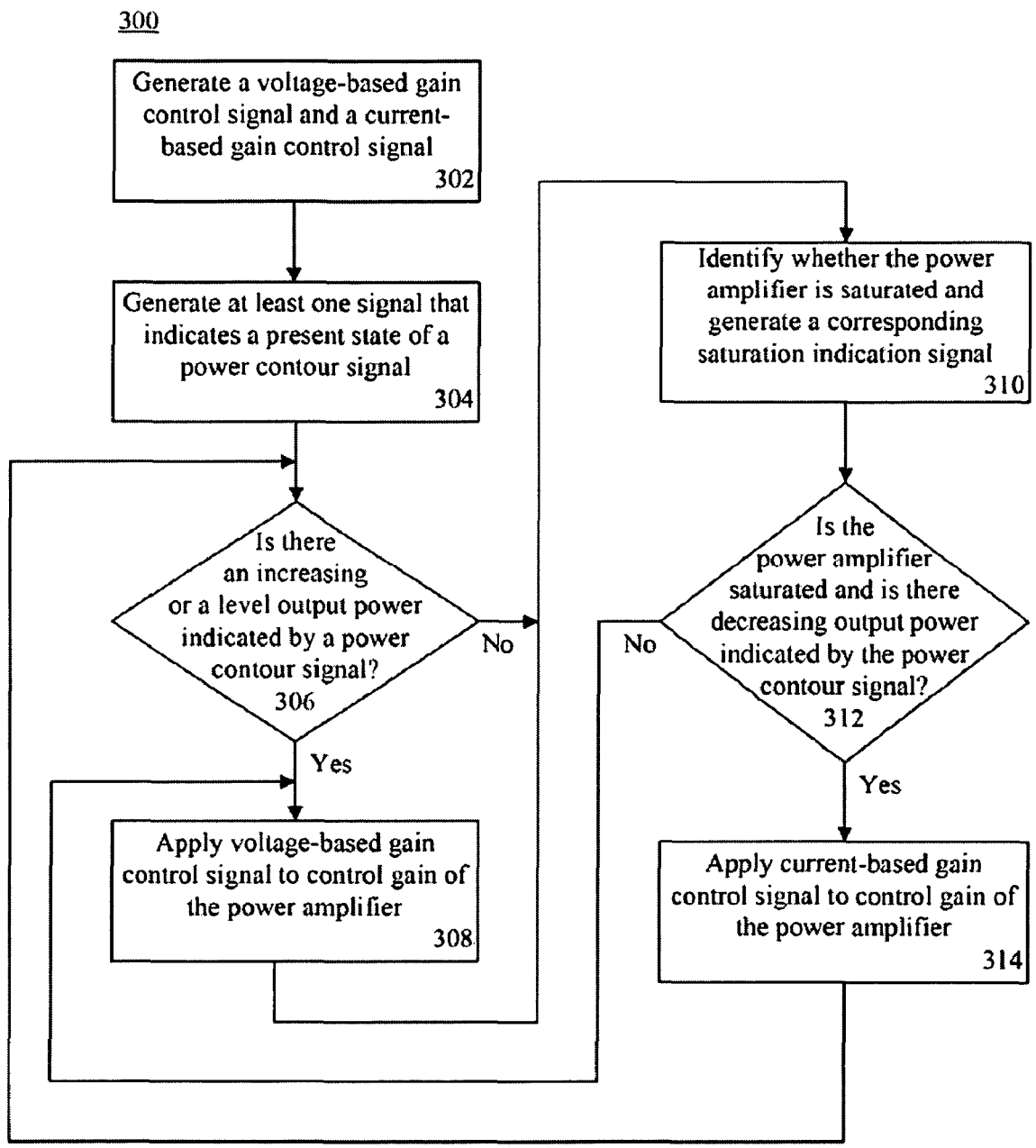
FIG. 3 depicts a flowchart presenting a method of controlling a gain of a power amplifier, which is useful for understanding the present invention.

FIG. 3 depicts a flowchart presenting a method 300 of controlling a gain of a power amplifier, which is useful for understanding the present invention. At step 302 a voltage-based gain control signal and a current-based gain control signal can be generated. At step 304, at least one signal that indicates a present state of a power contour signal can be generated. Referring to decision box 306, if there is an increasing or a level output power indicated by a power contour signal, at step 308 a voltage-based gain control signal can be applied to control gain of the power amplifier. Otherwise, the method 300 can proceed to step 310.

At step 310, whether the power amplifier is saturated can be identified, and a corresponding saturation indication signal can be generated. At decision box 312, a determination can be made as to whether the power amplifier is saturated and a decreasing output power is indicated by a power contour signal. If so, at step 314 a current-based gain control signal can be applied to control the gain of the power amplifier. Otherwise, the method 300 can proceed to step 308. The method 300 can continue while gain control of the power amplifier is desired.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

As above, any portion of the flowchart may be implemented as a computer program product for use with a computer system. Such implementations may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or analog communications lines) or a medium implemented with wireless techniques (e.g., microwave, infrared or other transmission techniques). The series of computer instructions embodies all or part of the functionality previously described herein with respect to the system. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g., a computer program product) and hardware. Still other embodiments of the invention are implemented as entirely hardware, or entirely software (e.g., a computer program product).

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e. open language).

Moreover, as used herein, ordinal terms (e.g. first, second, third, fourth, fifth, sixth, seventh, eighth, ninth, tenth, and so on) distinguish one message, signal, item, object, device, system, apparatus, step, process, or the like from another message, signal, item, object, device, system, apparatus, step, process, or the like. Thus, an ordinal term used herein need not indicate a specific position in an ordinal series. For example, a process identified as a "second process" may occur before a process identified as a "first process." Further, one or more processes may occur between a first process and a second process.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

This invention can be embodied in other forms without departing from the spirit or essential attributes thereof. Accordingly, reference should be made to the following claims, rather than to the foregoing specification, as indicating the scope of the invention.

The invention claimed is:

1. A method of controlling a gain of a power amplifier, the method comprising:
   applying a voltage-based gain control signal to control the gain of the power amplifier when a level output power of the power amplifier is indicated by a power contour signal;
   identifying whether the power amplifier is saturated; and
   applying a current-based gain control signal to control the gain of the power amplifier when the power amplifier is saturated and a decrease in output power is indicated by the power contour signal.

2. The method of claim 1, further comprising:
   applying the voltage-based gain control signal to the power amplifier when an increase in output power is indicated by a power contour signal.

3. The method of claim 1, further comprising:
   based on the power contour signal and the identification of whether the power amplifier is saturated, selectively controlling operation of a switch to select between the voltage-based gain control signal and the current-based gain control signal.

4. The method of claim 1, wherein identifying whether the power amplifier is saturated comprises:
   comparing to a voltage reference signal at least one signal selected from a group consisting of the voltage-based gain control signal, the current-based gain control signal, and an output signal of the power amplifier.

5. The method of claim 1, further comprising:
   generating at least one signal that indicates a present state of the power contour signal; and
   generating at least one saturation indication signal indicating whether the power amplifier is saturated.

6. The method of claim 1, further comprising:
   detecting a current level of an output signal generated by the power amplifier; and
   comparing the current level to the power contour signal to generate the current-based gain control signal.

7. The method of claim 1, further comprising:
   detecting a voltage level of an output signal generated by the power amplifier; and
   comparing the voltage level to the power contour signal to generate the voltage-based gain control signal.

8. The method of claim 1, further comprising:
   responsive to applying the current-based gain control signal, determining whether the power contour signal indicates an increase in or level output power; and
   applying the voltage-based gain control signal to control the gain of the power amplifier when the increase in or level output power is indicated by the power contour signal.

9. A method of controlling a gain of a power amplifier, the method comprising:
   generating a voltage-based gain control signal;
   generating a current-based gain control signal;
   identifying whether the power amplifier is saturated;
   applying the voltage-based gain control signal to control the gain of the power amplifier when an increase in output power or a level output power of the power amplifier is indicated by a power contour signal; and
   applying the current-based gain control signal to control the gain of the power amplifier when the power amplifier is saturated and a decrease in output power is indicated by the power contour signal.

10. The method of claim 9, further comprising:
    detecting current and voltage levels of an output signal generated by the power amplifier;
    comparing the current level to the power contour signal to generate the current-based gain control signal; and
    comparing the voltage level to the power contour signal to generate the voltage-based gain control signal.

11. The method of claim 9, further comprising:
    generating at least one latch timing signal that indicates a present state of the power contour signal; and
    generating at least one saturation indication signal indicating whether the power amplifier is saturated.

12. A hybrid power control system comprising:
    a voltage-based gain control circuit that generates a voltage-based gain control signal;
    a current-based gain control circuit that generates a current-based gain control signal;
    a saturation detection circuit that identifies whether a power amplifier is saturated; and
    a switch that applies the voltage-based gain control signal to control a gain of the power amplifier when an increase in output power of the power amplifier is indicated by a power contour signal and applies the current-based gain control signal to control the gain of the power amplifier when the power amplifier is saturated and a decrease in output power is indicated by the power contour signal.

13. The hybrid power control system of claim 12, wherein the switch applies the voltage-based gain control signal to the power amplifier when a level output power is indicated by a power contour signal.

14. The hybrid power control system of claim 12, wherein the saturation detection circuit controls operation of the switch to selectively apply the voltage-based gain control signal and the current-based gain control signal to control the gain of the power amplifier.

15. The hybrid power control system of claim 12, wherein the saturation detection circuit detects whether the power amplifier is saturated by comparing to a voltage reference signal at least one signal selected from a group consisting of the voltage-based gain control signal, the current-based gain control signal, and an output signal of the power amplifier.

16. The hybrid power control system of claim 12, wherein the saturation detection circuit generates at least one signal that indicates a present state of the power contour signal and generates at least one saturation indication signal indicating whether the power amplifier is saturated.

17. The hybrid power control system of claim 12, wherein the saturation detection circuit generates at least one signal that indicates the present state of the power contour signal.

18. The hybrid power control system of claim 12, wherein the current-based gain control circuit comprises:
a current sensor that detects a current level of an output signal generated by the power amplifier; and
a comparator that compares the current level to the power contour signal to generate the current-based gain control signal.

19. The hybrid power control system of claim 12, wherein the current-based gain control circuit detects a voltage level of an output signal generated by the power amplifier and compares the voltage level to the power contour signal to generate the voltage-based gain control signal.

20. The hybrid power control system of claim 12, wherein:
responsive to the switch applying the current-based gain control signal to control the gain of the power amplifier, the saturation detection circuit determines whether the power contour signal indicates a level output power or an increase in output power; and
the switch applies the voltage-based gain control signal to control the gain of the power amplifier when the level or increase in output power is indicated by the power contour signal.

* * * * *